(12) United States Patent
La Placa et al.

(10) Patent No.: US 7,167,394 B2
(45) Date of Patent: Jan. 23, 2007

(54) SENSE AMPLIFIER FOR READING A CELL OF A NON-VOLATILE MEMORY DEVICE

(75) Inventors: Michele La Placa, Cefalù (IT); Antonino Mondello, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1 day.

(21) Appl. No.: 11/121,616

(22) Filed: May 4, 2005

(65) Prior Publication Data

US 2005/0249007 A1 Nov. 10, 2005

(30) Foreign Application Priority Data

May 4, 2004 (IT) .......................... VA2004A0021

(51) Int. Cl.
*G11C 11/34* (2006.01)
(52) U.S. Cl. ................................ 365/185.2; 365/185.21
(58) Field of Classification Search ................ 365/210, 365/205, 207, 208, 185.2, 185.21
See application file for complete search history.

(56) References Cited

U.S. PATENT DOCUMENTS

| | | | | |
|---|---|---|---|---|
| 5,258,959 A | * | 11/1993 | Dallabora et al. ..... | 365/185.21 |
| 6,392,943 B2 | * | 5/2002 | Fournel .................. | 365/185.21 |
| 6,400,607 B1 | * | 6/2002 | Pasotti et al. .......... | 365/185.21 |
| 6,434,068 B1 | * | 8/2002 | Harada et al. ......... | 365/185.21 |
| 6,707,717 B2 | * | 3/2004 | Jun-Lin ................. | 365/185.21 |
| 6,873,551 B2 | * | 3/2005 | Bedarida et al. ....... | 365/185.21 |
| 6,930,922 B2 | * | 8/2005 | Mori et al. ............ | 365/185.21 |

* cited by examiner

*Primary Examiner*—Trong Phan
(74) *Attorney, Agent, or Firm*—Lisa K. Jorgenson; Allen, Dyer, Doppelt, Milbrath & Gilchrist, P.A.

(57) ABSTRACT

A sense amplifier for reading a non-volatile memory cell includes a bitline current path connected to a non-volatile memory cell to be read, and a reference current path connected to a reference memory cell. A current mirror includes an input transistor and a corresponding input node, and an output transistor and a corresponding output node. The current mirror converts currents in the reference current path and the bitline current path to respective voltages on the input and output nodes. An equalization circuit equalizes the voltages on the input and output nodes of the current mirror and is activated by a command signal. The equalization circuit includes a switch controlled by the command signal, and a diode-connected load transistor connected in parallel to the output transistor of the current mirror and connected to the output node thereof through the switch. A current steering path draws from the bitline current path a current when enabled by the command signal so that the load transistor establishes a desired voltage on the output node.

25 Claims, 5 Drawing Sheets

US 7,167,394 B2

SENSE AMPLIFIER FOR READING A CELL OF A NON-VOLATILE MEMORY DEVICE

FIELD OF THE INVENTION

The invention relates in general to non-volatile semiconductor memory devices, and more particularly, to a sense amplifier for reading a cell of a non-volatile memory device.

BACKGROUND OF THE INVENTION

Non-volatile semiconductor memory devices comprise an array of cells organized in singularly addressable rows and columns. Each cell typically comprises a floating gate MOSFET, a current terminal of which is connected to a bitline and a control terminal of which is connected to a wordline. To establish the logic state of the data stored in a cell, the voltage on the wordline and on the bitline to which the cell to be read belongs is increased. The current that flows through it is compared with the current absorbed by a programmed reference cell.

The diagram of a typical sense amplifier for an EPROM or a FLASH-EEPROM memory device is depicted in FIG. 1. The sense amplifier comprises a bitline current path, a reference current path, and an equalization circuit for eventually comparing the currents circulating in the two paths.

The bitline current path includes the pre-charge transistor M6 and the bitline selection transistors M4 and M2 respectively controlled by the logic gate NR2, by the inverted enable signal ENABLE_N and by the selection signal Y0 for the memory cell selected to be read (not depicted in figure) that absorbs a current $I_{CELL}$. The reference current path includes NR1, M5, M3, M1 and the reference cell (not depicted) and is identical to the bitline path but is activated by the respective inverted enable signal RFENABLE_N. If the cell to be read is not programmed, $I_{CELL}>I_{REF}$ and if the cell is programmed $I_{CELL}<I_{REF}$.

The sense amplifier further comprises a current mirror M8, M9 that functions as a current-to-voltage converter for developing voltages on its input nodes REF and output nodes MAT corresponding to the currents $I_{REF}$ and $I_{CELL}$, respectively. These voltages are then compared by a comparator that generates a logic signal DIFFOUT that is buffered (SAOUT) by a cascade of two inverters. The logic signal DIFFOUT indicates whether the read cell is programmed or not.

A desired feature of the sense amplifiers is that of rapidly generating a pre-established voltage on the node MAT for comparing this voltage with the voltage on the node REF as fast as possible for reducing the time of evaluating a memory cell. Sense amplifiers typically comprise an equalization line, which in FIG. 1 includes the MOSFET M7, for making equal the voltages on the nodes REF and MAT before starting a read operation. Therefore, the voltage on the node MAT is at a value relatively close to the voltage REF before the cell state is evaluated, and may quickly reach the level corresponding to the programmed or to non-programmed state of the cell.

Different forms of equalization lines, even more complex than the one depicted in FIG. 1, are known. They all have the function of making equal the potentials of certain "critical" nodes of the sense circuit (in the depicted example the nodes MAT and REF) before the evaluation step. This is done to speed up the production of the comparison signal DIFFOUT between the voltages sensed on the nodes MAT and REF once the equalization line is disabled by the control signal SAEQ at the appropriate instant.

This time instant is defined in consideration of the charging of the capacitances of the selected bitline and wordline. The equalization line is disabled when the voltages on the selected rows and columns have reached the steady-state value or at least a value that will ensure that the evaluation will not be affected by uncertainty. Obviously, this depends on the time constant RC associated to the bitline and wordline current paths of the memory.

The timing of the signal SAEQ is determined for the reading speed of the memory. For this reason, memory devices are provided with delay networks trimmable by metal-fuses or by UPROM based upon the use of dedicated dummy lines.

The sense amplifier of FIG. 1 has various drawbacks. The first drawback is due to the capacitive coupling between the nodes MAT and REF when SAEQ switches low opening the switch M7. The second drawback is the need of having a reference path for each sense amplifier dedicated to each data output. This significantly complicates the circuit (distribution of the reference current) and results in a large area of silicon being used.

The third drawback is a relatively large pre-charge time of the bitlines and wordlines. The voltages on the selected row and column should reach the stand-by value before the signal SAEQ may switch. Otherwise, there will be a transient due to the difference between the current flowing in the array cell $I_{CELL}$ and the current flowing in the I/V converter resulting in a time loss.

SUMMARY OF THE INVENTION

In view of the foregoing background, an object of the preset invention is to provide a sense amplifier that overcomes the above noted drawbacks.

This and other objects, advantages and features in accordance with the invention are provided by a sense amplifier comprising an equalization network for the voltages on the nodes MAT and REF without short-circuiting these two nodes for equalizing the voltage levels before evaluating the state of a memory. The nodes MAT and REF may be equalized by an equalization circuit employing a diode-connected load transistor that is connectable to the node MAT through a switch, and which is biased for bringing the node MAT to a desired voltage.

More precisely, the sense amplifier reads a non-volatile memory cell and includes a bitline current path comprising a memory cell to be read, a reference current path comprising a reference memory cell, and a current mirror. The current mirror converts the currents flowing through the reference current path and through the bitline current to respective voltages on the input and output nodes of the current mirror. An equalization circuit for the voltages on the input and output nodes of the current mirror may be enabled by a command signal.

The sense amplifier overcomes the above mentioned problems affecting known sense amplifiers because the equalization circuit comprises a diode-connected load transistor that may be connected in parallel to the output transistor of the current mirror and to the output node through a switch controlled by the command signal. A current steering path is connected to the bitline path for drawing a pre-established current larger than or equal to the reference current when enabled by the command signal. This allows the load transistor to establish a desired voltage on the output node.

BRIEF DESCRIPTION OF THE DRAWINGS

The invention is described while referring to the attached drawings, wherein.

DETAILED DESCRIPTION OF THE PREFERRED EMBODIMENTS

Figure 1:
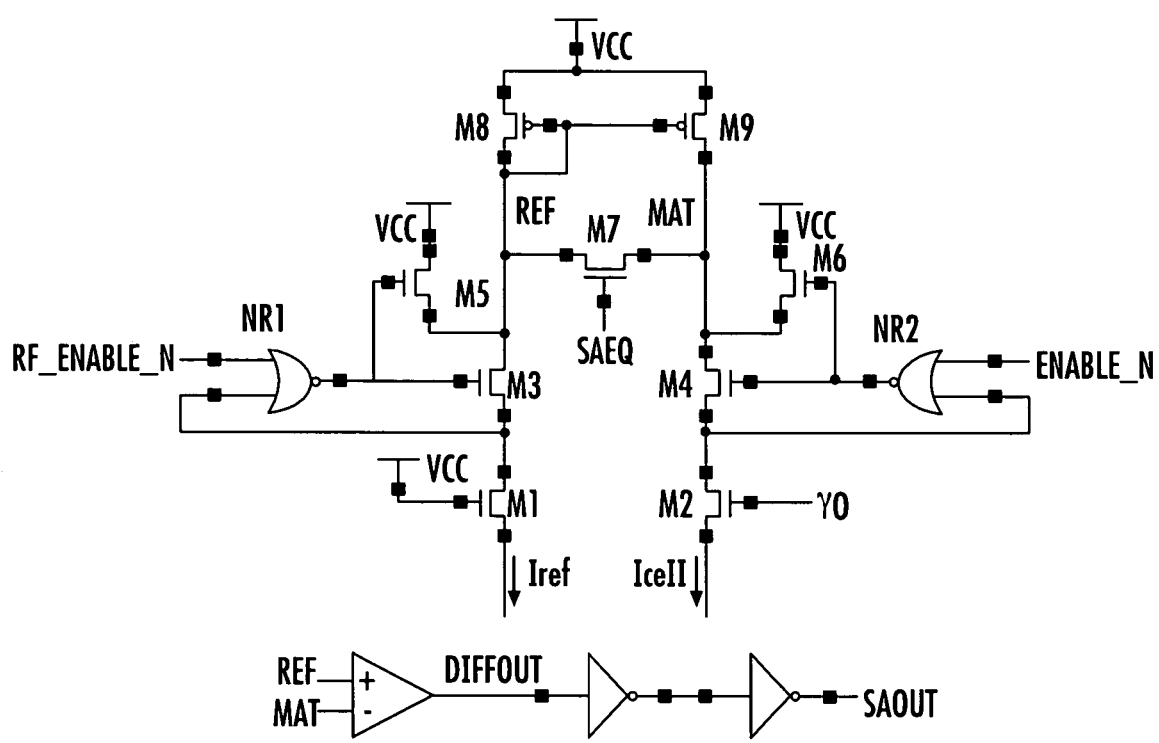
FIG. 1 is a schematic diagram of a sense amplifier according to the prior art.
Figure 2:
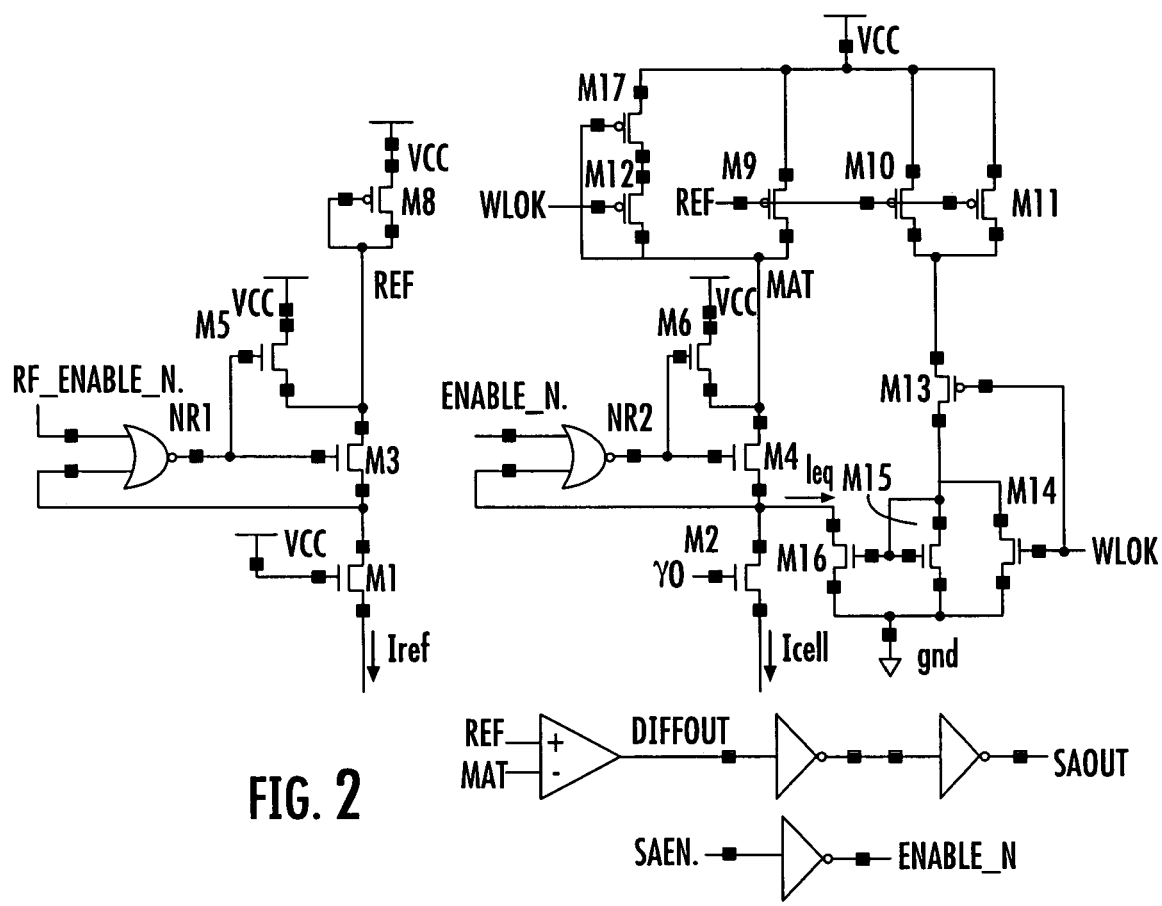
FIG. 2 is a schematic diagram of a preferred embodiment of the sense amplifier according to the present invention.

A sense amplifier in accordance with the present invention is shown in FIG. 2. The general enabling signal SAEN is used to generate the inverted ENABLE_N signal via the illustrated inverter in the lower right hand portion of FIG. 2. The sense amplifier comprises a reference current path, a bitline current path and a current mirror M8, M9 identical to those of the sense amplifier of FIG. 1. Differently from the latter, the equalization circuit for the voltages on the nodes MAT and REF includes the diode-connected load transistor M17, connected in parallel to the transistor M9 and to the node MAT through the switch M12 that is controlled by a command signal WLOK.

A current steering path M10, M11, M13, M14, M15, M16 draws from the bitline current path a pre-established current $I_{EQ}$ when it is enabled by the signal WLOK=0. The value of the current $I_{EQ}$ is established by the transistors M10 and M11 and is larger than or equal to the reference current $I_{REF}$.

To better understand the functioning of the amplifier shown in FIG. 2, assume that the transistors M17, M10 and M11 are identical to the transistor M8, and as a consequence, the current $I_{EQ}$ is twice the reference current $I_{REF}$. Furthermore, the cell to be read is programmed, that is:

$$I_{CELL}=0$$

During the equalization phase that precedes the evaluation phase of the logic state of the cell, the signal WLOK is null, thus the current mirror M15, M16 draws a current $I_{EQ}=2*I_{REF}$ from the bitline path. The pre-charge transistor M6 injects a current in the transistor M4 only during the charging phase of the bitline, then the current flowing in it is null. The current I(M4) flowing in the transistor M4 is:

$$I(M4)=I_{CELL}+2*I_{REF}$$

The switch M12 is in a conduction state when WLOK=0. The current flowing in the transistor M17 is:

$$I_{CELL}+I_{REF}=I_{REF}$$

Through the diode M17 flows the same current that flows in the transistor M8 and the diode connected between the node MAT and the supply VCC is exactly as transistor M8. As a consequence, the voltage on the node MAT equals the voltage on the node REF. The voltages on these two nodes are equalized without using a switch for shorting them.

The advantages are evident. There are no parasitic capacitances added on the node MAT, thus it is possible to increase the reading speed. The potential of the reference node REF is not modified and there is not any disturbance when the equalization circuit is disabled. When WLOK=1 the drain current $I_{EQ}$ of the NMOS M16 becomes null because the switch M13 is open, and the switch M14 shorts the transistor M15. Even the current flowing in the transistor M17 becomes null, and the node MAT rapidly reaches the voltage VCC.

Figure 3:
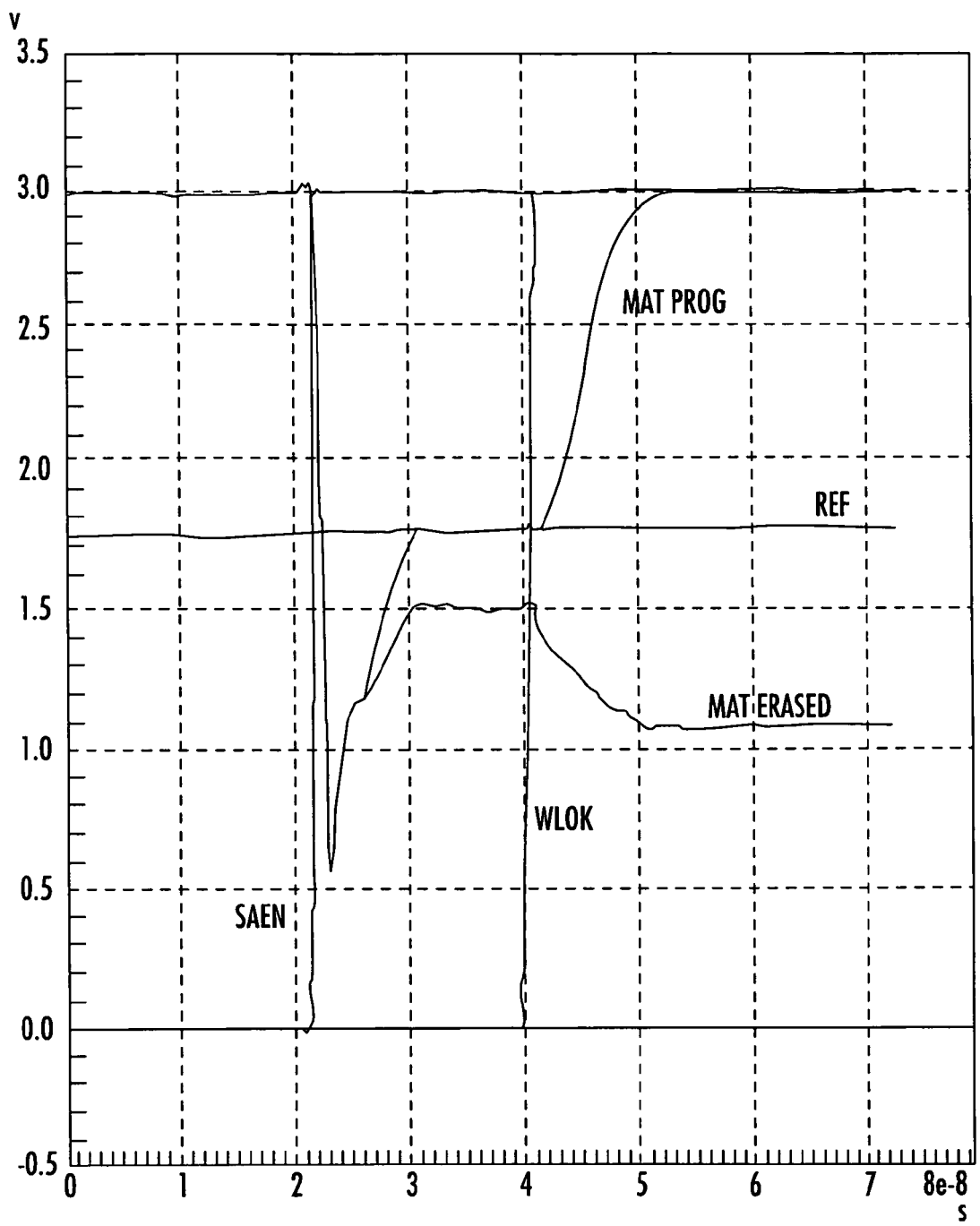
FIG. 3 is a graph of the main signals for the sense amplifier illustrated in FIG. 2 when there is no leakage current in a programmed cell to be read, with $I_{EQ}=2*I_{REF}$.

As may be inferred from the results of simulations depicted in FIG. 3, when the general enabling signal SAEN is active, the node MAT reaches a certain voltage. As soon as WLOK=1, the voltage on the node MAT (MAT_PROG) immediately differs from the voltage on the node REF.

If the cell is not programmed, it is $$I_{CELL}>I_{REF}$$

Given that $$I(M4)=I_{CELL}+2*I_{REF}$$

and that the current flowing in the transistor M9 equals the reference current $I_{REF}$ when WLOK=0 in the load transistor M17 flows a current $I_{CELL}>I_{REF}$. Thus, the voltage on the node MAT is smaller than the voltage on the node REF.

When WLOK switches (WLOK=1) for reading the cell, through the transistor M9 flows the current $I_{CELL}<I_{REF}$. The voltage on the node MAT remains smaller than the voltage on the node REF. Therefore, in case of a non-programmed cell (erased), during the equalization phase the potential of the node MAT assumes the correct level MAT ERASED. The level is smaller than the potential of the node REF, and remains smaller than this potential in the successive evaluation phase. As a consequence, it is possible to read correctly a non-programmed cell before the equalization phase ends and WLOK=1.

In the case in which the cell to be read is programmed and there is a bitline leakage current, the voltages on the nodes MAT and REF are not equalized. The current $I_{CELL}$ flowing through the memory cell to be read is not null because of the leakage current. In the transistor M17 flows a current larger than $I_{REF}$ when WLOK=0. The voltage on the node MAT is smaller than that on the node REF. When WLOK switches (WLOK=1), it is necessary to wait till the voltage on the node MAT surpasses the voltage on the node REF before the memory cell is evaluated as programmed.

Figure 4:
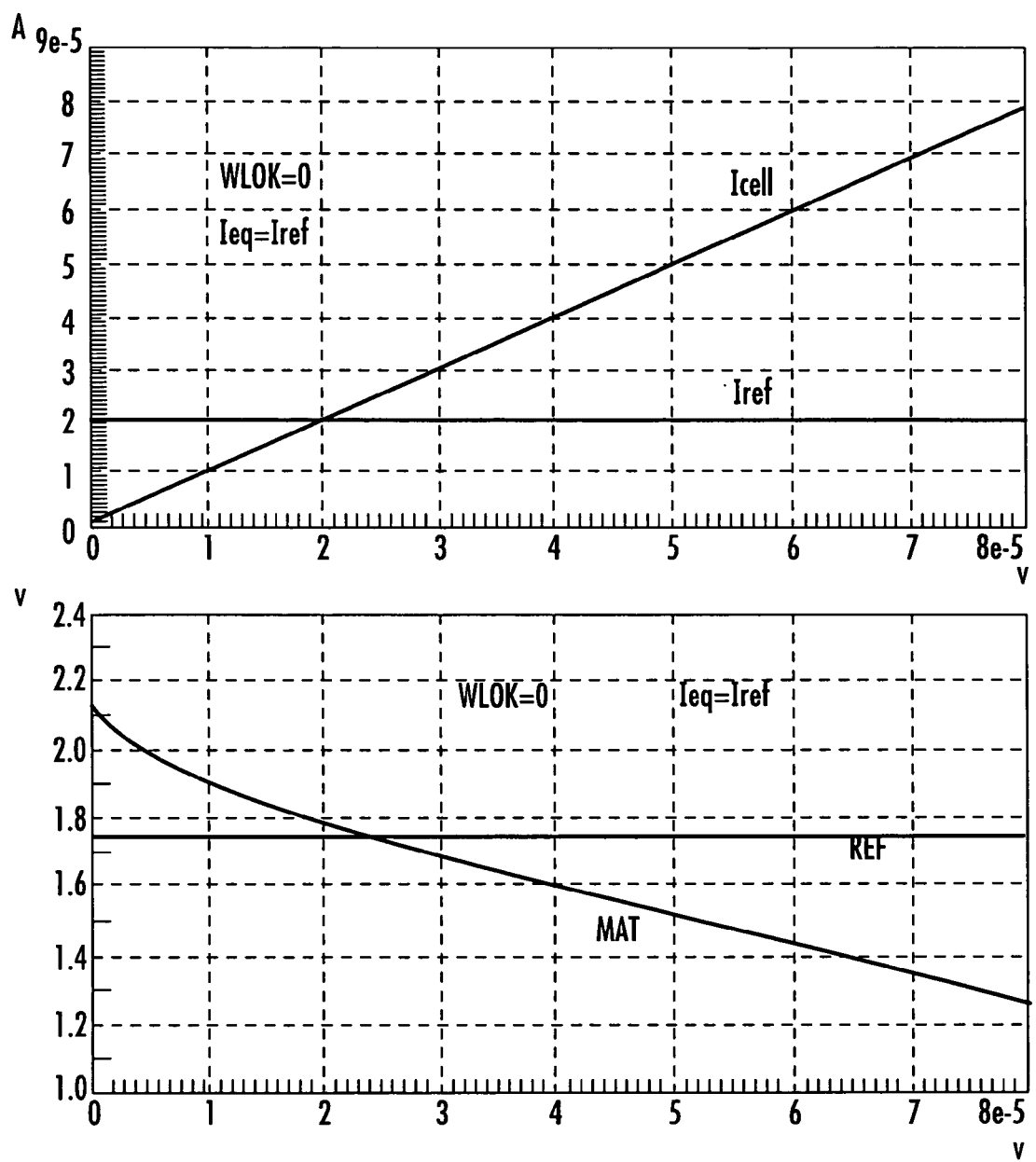
FIGS. 4 and 5 are graphs of the main signals for the sense amplifier illustrated in FIG. 2 when there is a leakage current in a programmed cell to be read, with $I_{EQ}=I_{REF}$.

If a bitline leakage is present, it is more convenient to choose the current $I_{EQ}$ equal to the current $I_{REF}$, and this may be done by suitably dimensioning the transistors M10 and M11 (or equivalently by eliminating the transistor M11 and designing M10 equal to M8). In such a case, when WLOK=0, the current $I_{CELL}$, equal to the leakage current, flows through M17. As long as the leakage current is smaller than the reference current $I_{REF}$, the node MAT will be at a voltage larger than the voltage on the node REF, as shown in FIG. 4, and will remain larger than this voltage even when the signal WLOK switches (WLOK=1).

Figure 5:
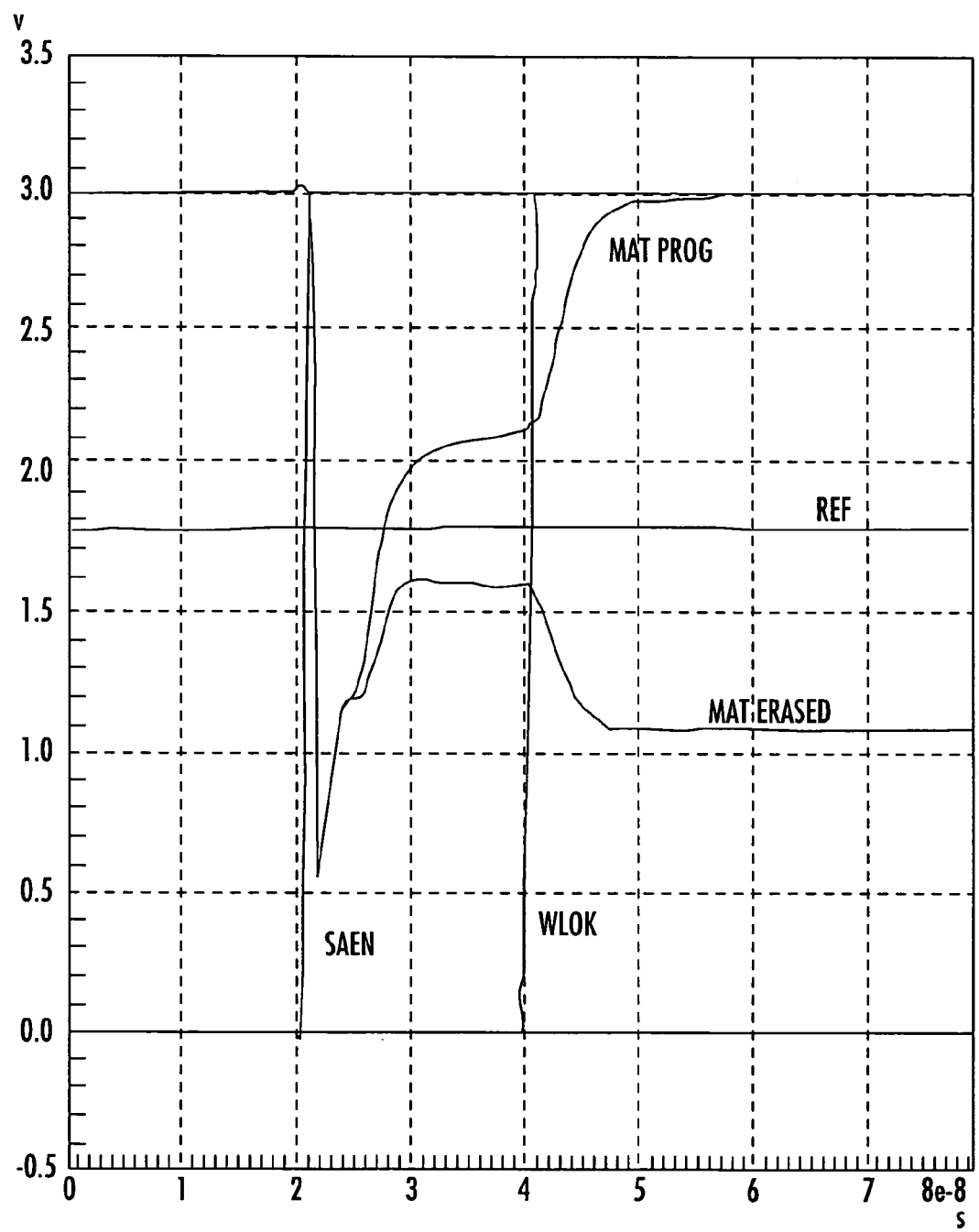

Diagrams of the signals for the sense amplifier, similar to that of FIG. 3 for the case in which $I_{EQ}=I_{REF}$, are shown in FIG. 5. It is evident that the programmed cell may be read as soon as WLOK=1 and that the switching instant of WLOK may be anticipated to an instant that depends upon the pre-charging characteristics of wordlines and/or bitlines, thus increasing the reading speed.

A further advantage on the sense amplifier of the invention compared to the known amplifier of FIG. 1 is that it is not necessary to form a comparison reference current path for each sense amplifier of a non-volatile memory because there is no switch that directly connects the node MAT of a bitline current path to the node REF of the reference current path. As a consequence, it is possible to use the same reference current path for more bitlines without influencing functioning of the memory and with a significant saving in silicon area.

The invention claimed is:

1. A sense amplifier for reading a non-volatile memory cell comprising:
   a bitline current path connected to a non-volatile memory cell to be read;
   a reference current path connected to a reference memory cell;
   a current mirror comprising an input transistor and a corresponding input node, and an output transistor and a corresponding output node, said current mirror for converting currents in the reference current path and the bitline current path to respective voltages on the input and output nodes; and
   an equalization circuit for equalizing the voltages on the input and output nodes of said current mirror and being activated by a command signal, said equalization circuit comprising
      a switch controlled by the command signal,
      a diode-connected load transistor connected in parallel to the output transistor of said current mirror and connected to the output node thereof through said switch, and
      a current steering path drawing from the bitline current path a current larger than or equal to a reference current in the reference current path when enabled by the command signal so that said load transistor establishes a desired voltage on said output node.

2. A sense amplifier according to claim 1, wherein said load transistor is identical to the input transistor of said current mirror.

3. A sense amplifier according to claim 1, wherein said current steering path comprises:
   a second current mirror comprising input and output transistors, with the output transistor connected in parallel to said bitline current path; and
   a current generator activated by the command signal for providing the current to the input transistor of said second current mirror.

4. A sense amplifier according to claim 1, wherein the current is twice the reference current.

5. A sense amplifier according to claim 1, wherein the current equals the reference current.

6. A sense amplifier according to claim 3, wherein said current generator comprises:
   a first pair of transistors mirrored with the input transistor of said first current mirror; and
   an activation transistor connected in series to said first pair of transistors and being enabled by the command signal.

7. A sense amplifier according to claim 3, further comprising a transistor for shorting the input transistor of said second current mirror that is in a conducting state when the command signal disables said current generator.

8. A memory comprising:
   an array of non-volatile memory cells arranged in rows and columns; and
   a plurality of sense amplifiers connected to said array of non-volatile memory cells, each sense amplifier comprising
      a bitline current path connected to a non-volatile memory cell to be read,
      a reference current path connected to a reference memory cell,
      a current mirror comprising an input transistor and a corresponding input node and an output transistor and a corresponding output node, said current mirror for converting currents in the reference current path and the bitline current path to respective voltages on the input and output nodes, and
      an equalization circuit for equalizing the voltages on the input and output nodes of said current mirror and being activated by a command signal, said equalization circuit comprising
         a switch controlled by the command signal,
         a load connected in parallel to the output transistor of said current mirror and connected to the output node thereof through said switch, and
         a current steering path drawing from the bitline current path a current when enabled by the command signal so that said load establishes a desired voltage on said output node.

9. A memory according to claim 8, wherein said load comprises a diode-connected load transistor.

10. A memory according to claim 8, wherein said load is identical to the input transistor of said current mirror.

11. A memory according to claim 8, wherein the current drawn from the bitline current path is larger than or equal to a reference current in the reference current path.

12. A memory according to claim 8, wherein said current steering path comprises:
   a second current mirror comprising input and output transistors, with the output transistor connected in parallel to said bitline current path; and
   a current generator activated by the command signal for providing the current to the input transistor of said second current mirror.

13. A memory according to claim 8, wherein the current is twice the reference current.

14. A memory according to claim 8, wherein the current equals the reference current.

15. A memory according to claim 12, wherein said current generator comprises:
   a first pair of transistors mirrored with the input transistor of said first current mirror; and
   an activation transistor connected in series to said first pair of transistors and being enabled by the command signal.

16. A memory according to claim 12, further comprising a transistor for shorting the input transistor of said second current mirror that is in a conducting state when the command signal disables said current generator.

17. A method for reading a non-volatile memory cell using a sense amplifier comprising a bitline current path connected to a non-volatile memory cell to be read; a reference current path connected to a reference memory cell; and a current mirror comprising an input transistor and a corresponding input node and an output transistor and a corresponding output node, the method comprising:
   converting currents in the reference current path and the bitline current path to respective voltages on the input and output nodes of the current mirror; and
   equalizing the voltages on the input and output nodes of the current mirror in response to a command signal, the equalizing being performed by an equalization circuit comprising a switch controlled by the command signal, and a load connected in parallel to the output transistor of the current mirror and connected to the output node thereof through the switch, and a current steering path, the equalizing comprising drawing from the bitline current path a current when enabled by the command signal so that the load establishes a desired voltage on the output node.

18. A method according to claim 17, wherein the load comprises a diode-connected load transistor.

19. A memory according to claim 17, wherein the load is identical to the input transistor of the current mirror.

20. A method according to claim 17, wherein the current drawn from the bitline current path is larger than or equal to a reference current in the reference current path.

21. A method according to claim 17, wherein the current steering path comprises:
   a second current mirror comprising input and output transistors, with the output transistor connected in parallel to the bitline current path; and
   a current generator activated by the command signal for providing the current to the input transistor of the second current mirror.

22. A method according to claim 17, wherein the current is twice the reference current.

23. A method according to claim 17, wherein the current equals the reference current.

24. A method according to claim 21, wherein the current generator comprises:
   a first pair of transistors mirrored with the input transistor of the first current mirror; and
   an activation transistor connected in series to the first pair of transistors and being enabled by the command signal.

25. A method according to claim 21, further comprising a transistor for shorting the input transistor of the second current mirror that is in a conducting state when the command signal disables the current generator.

* * * * *